US011175159B2

United States Patent
Yamamoto et al.

(10) Patent No.: US 11,175,159 B2
(45) Date of Patent: Nov. 16, 2021

(54) LEARNING SYSTEM AND LEARNING METHOD FOR VEHICLES

(71) Applicant: AICHI STEEL CORPORATION, Aichi (JP)

(72) Inventors: Michiharu Yamamoto, Aichi (JP); Tomohiko Nagao, Aichi (JP); Hitoshi Aoyama, Aichi (JP)

(73) Assignee: AICHI STEEL CORPORATION, Tokai (JP)

( * ) Notice: Subject to any disclaimer, the term of this patent is extended or adjusted under 35 U.S.C. 154(b) by 403 days.

(21) Appl. No.: 16/326,221

(22) PCT Filed: Aug. 24, 2017

(86) PCT No.: PCT/JP2017/030258
§ 371 (c)(1),
(2) Date: Feb. 18, 2019

(87) PCT Pub. No.: WO2018/043267
PCT Pub. Date: Mar. 8, 2018

(65) Prior Publication Data
US 2019/0212169 A1   Jul. 11, 2019

(30) Foreign Application Priority Data
Aug. 30, 2016   (JP) .............................. JP2016-168473

(51) Int. Cl.
*G01C 25/00*   (2006.01)
*G01C 21/28*   (2006.01)
(Continued)

(52) U.S. Cl.
CPC ............. *G01C 25/00* (2013.01); *G01C 21/28* (2013.01); *G08G 1/0104* (2013.01); *G08G 1/133* (2013.01); *G06K 9/00798* (2013.01)

(58) Field of Classification Search
USPC .......................................................... 702/87
See application file for complete search history.

(56) References Cited

U.S. PATENT DOCUMENTS

| 5,815,825 | A |   | 9/1998 | Tachibana et al. |
| 5,913,375 | A | * | 6/1999 | Nishikawa ............. G05D 1/027 180/168 |

(Continued)

FOREIGN PATENT DOCUMENTS

| EP | 1 020 707 A1 | 7/2000 |
| JP | H08-314540 A | 11/1996 |

(Continued)

OTHER PUBLICATIONS

Extended European Search Report dated Mar. 23, 2020 in European Application No. 17846272.7.

(Continued)

*Primary Examiner* — Paul D Lee
(74) *Attorney, Agent, or Firm* — Xsensus LLP

(57) ABSTRACT

A learning system (1) for vehicles for learning a neutral point of a measurement sensor equipped in a vehicle by using a magnetic marker disposed in a traveling road includes a sensor unit (11) which detects the magnetic marker and measures a lateral shift amount of the vehicle with respect to the magnetic marker, a route information acquiring part which acquires route information indicating a shape of the traveling road, and a learning determination part which determines whether a learning condition as a condition for performing learning of the neutral point of the measurement sensor is satisfied, wherein a fluctuation range of a lateral shift amount measured by the sensor unit (11) when the vehicle is traveling a learning road as a traveling (Continued)

road in a constant shape is equal to or smaller than a predetermined threshold is set at least as the learning condition.

18 Claims, 12 Drawing Sheets

(51) Int. Cl.
*G08G 1/133* (2006.01)
*G08G 1/01* (2006.01)
*G06K 9/00* (2006.01)

(56) References Cited

U.S. PATENT DOCUMENTS

| | | |
|---|---|---|
| 5,913,376 A | 6/1999 | Takei |
| 6,215,392 B1 | 4/2001 | Okada |
| 2003/0106731 A1 | 6/2003 | Marino et al. |
| 2015/0247719 A1 | 9/2015 | Huang et al. |
| 2015/0294430 A1* | 10/2015 | Huang .................. B60W 10/18 705/7.24 |
| 2015/0294566 A1* | 10/2015 | Huang .................. G08G 1/133 701/41 |

FOREIGN PATENT DOCUMENTS

| | | |
|---|---|---|
| JP | H10-160486 A | 6/1998 |
| JP | H10-213446 A | 8/1998 |
| JP | 2000-306195 A | 11/2000 |
| JP | 2006-199242 A | 8/2006 |
| JP | 2007-04711 A | 1/2007 |

OTHER PUBLICATIONS

International Search Report dated Nov. 28, 2017 for PCT/JP2017/030258 filed on Aug. 24, 2017, 9 pages, including English-language Translation.

* cited by examiner

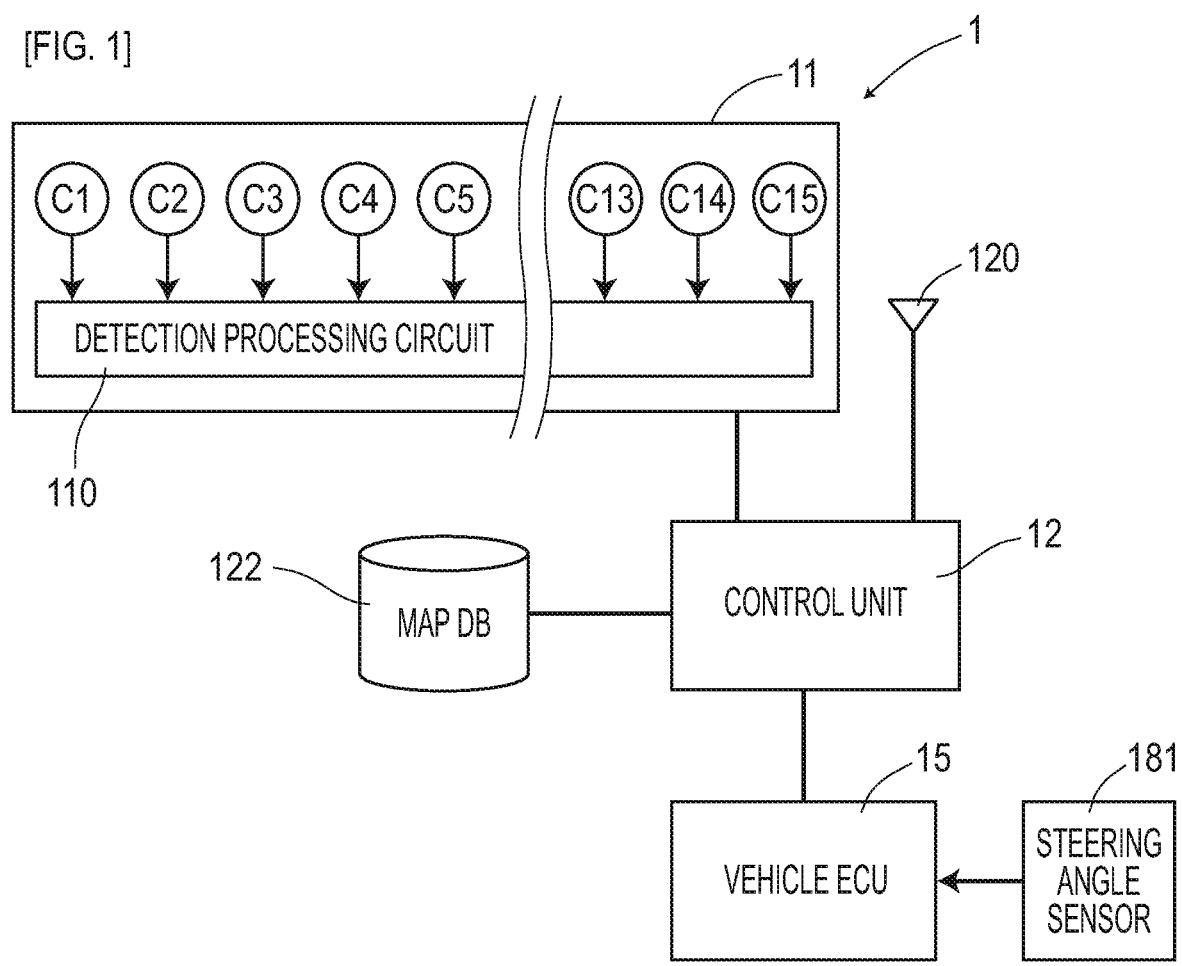

[FIG. 2]
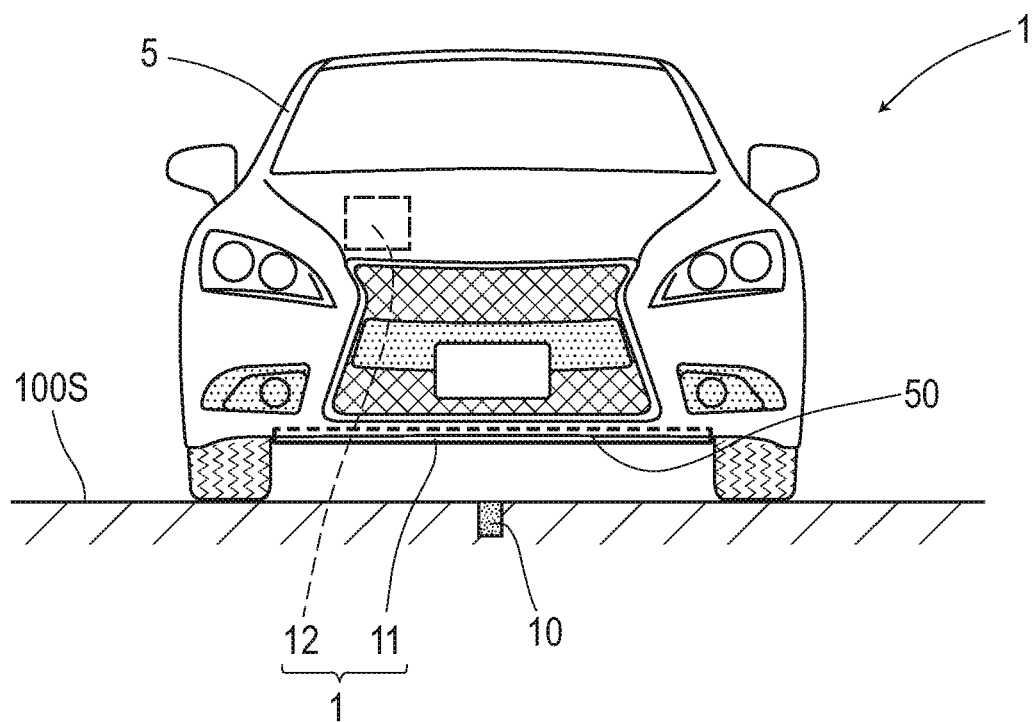

[FIG. 3]
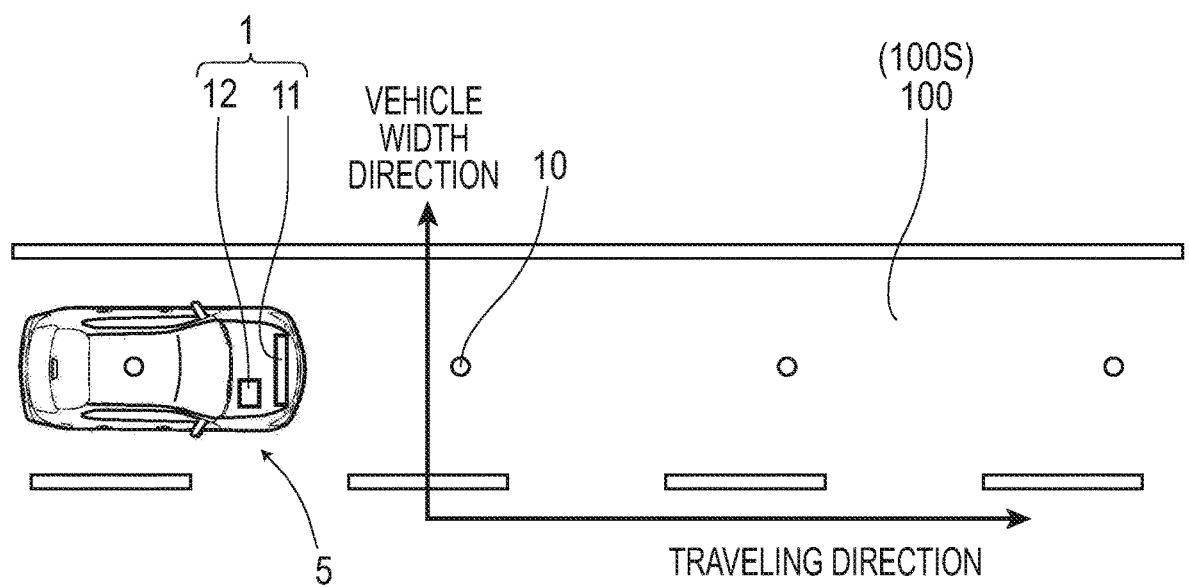

[FIG. 4]
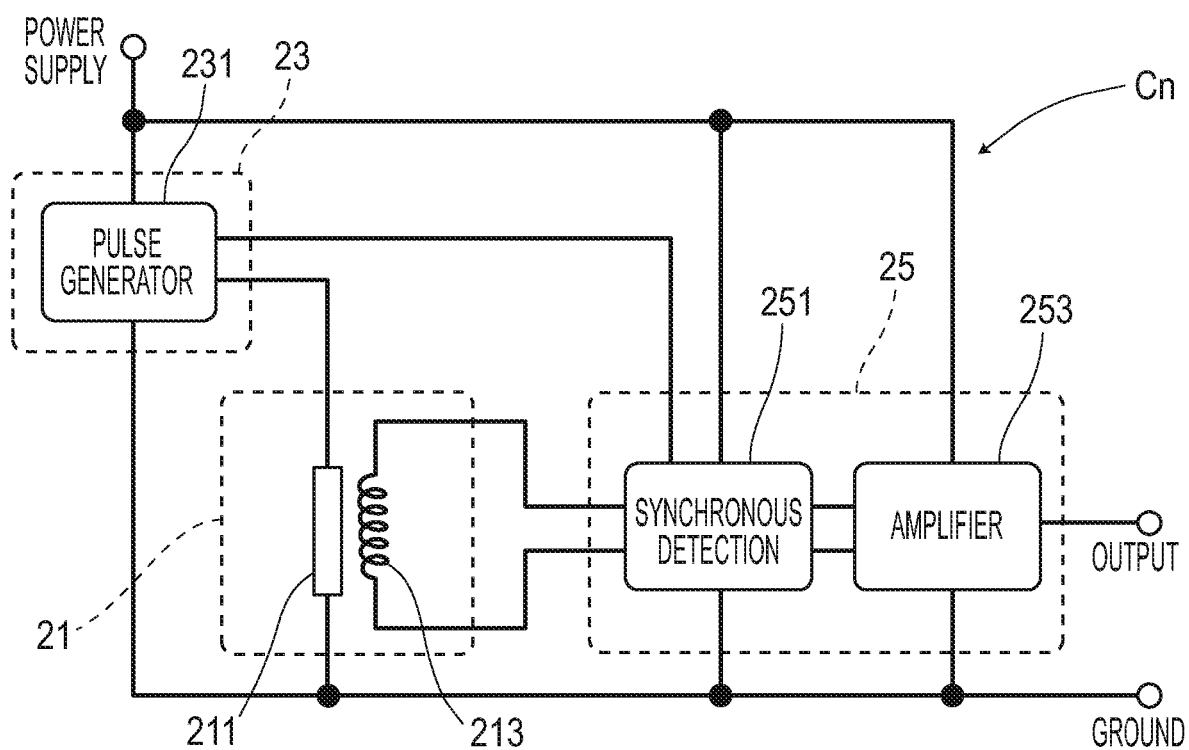

[FIG. 5]
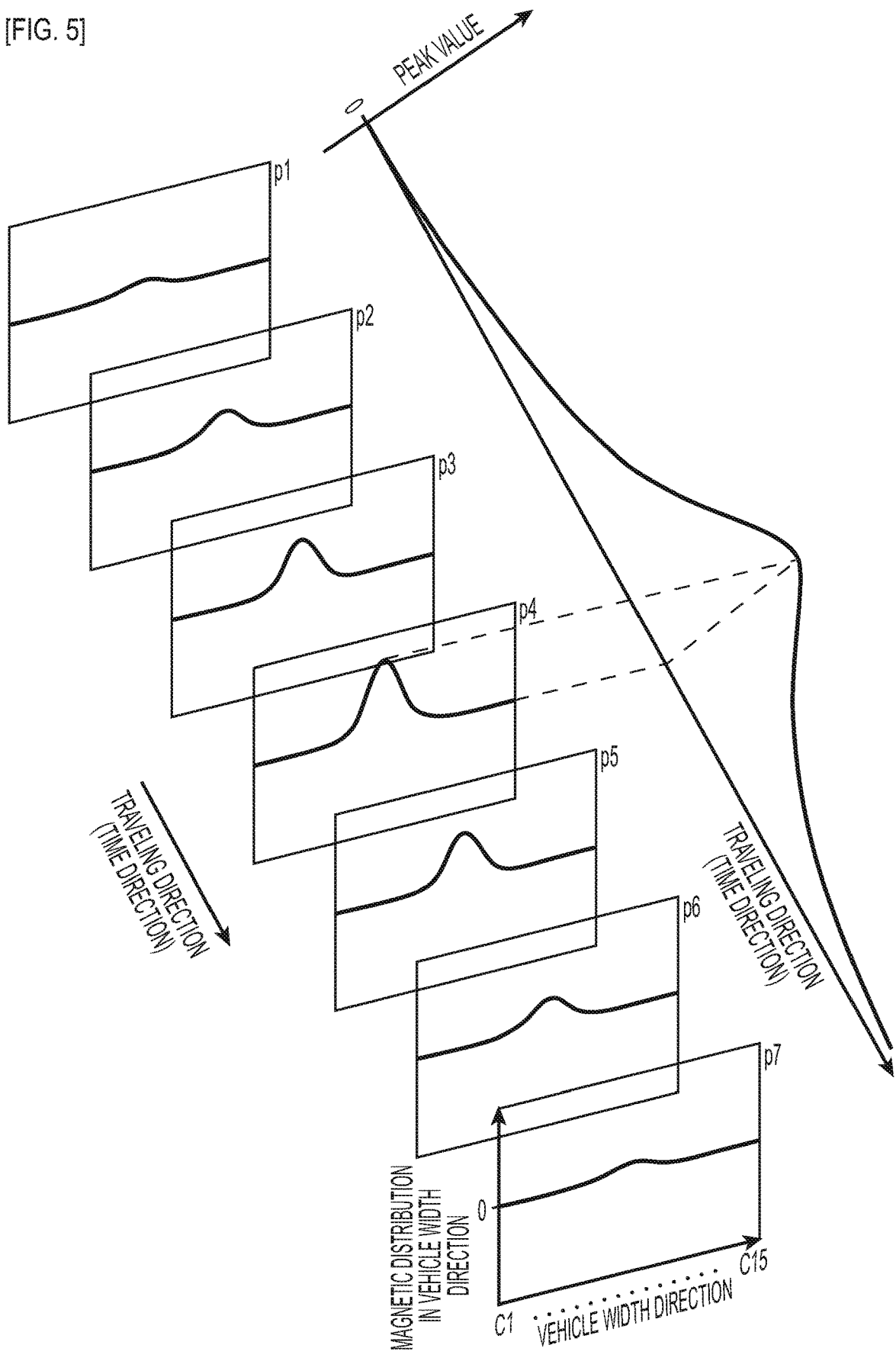

[FIG. 6]
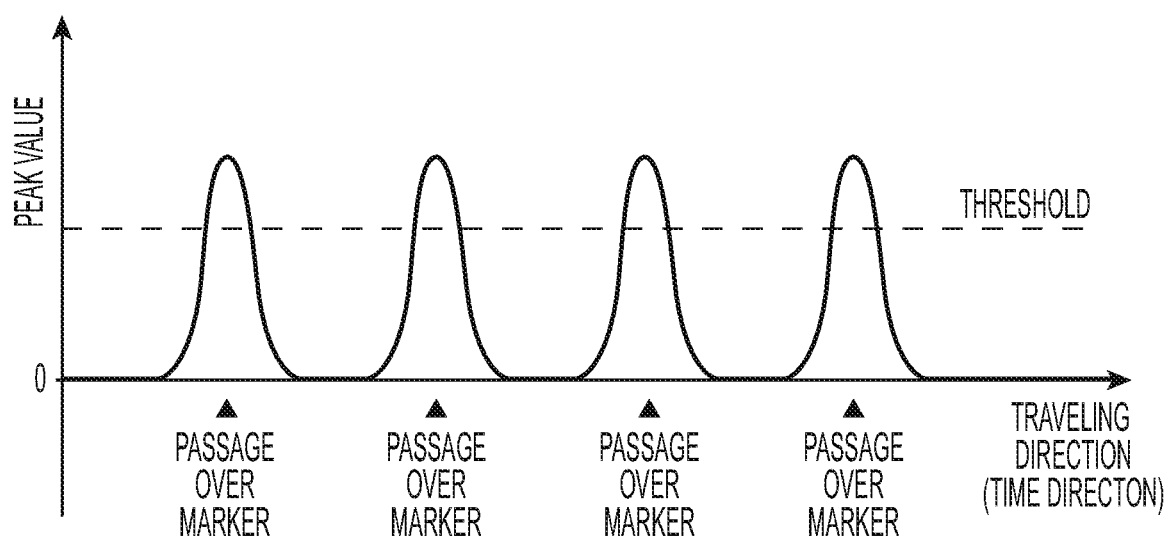

[FIG. 7]
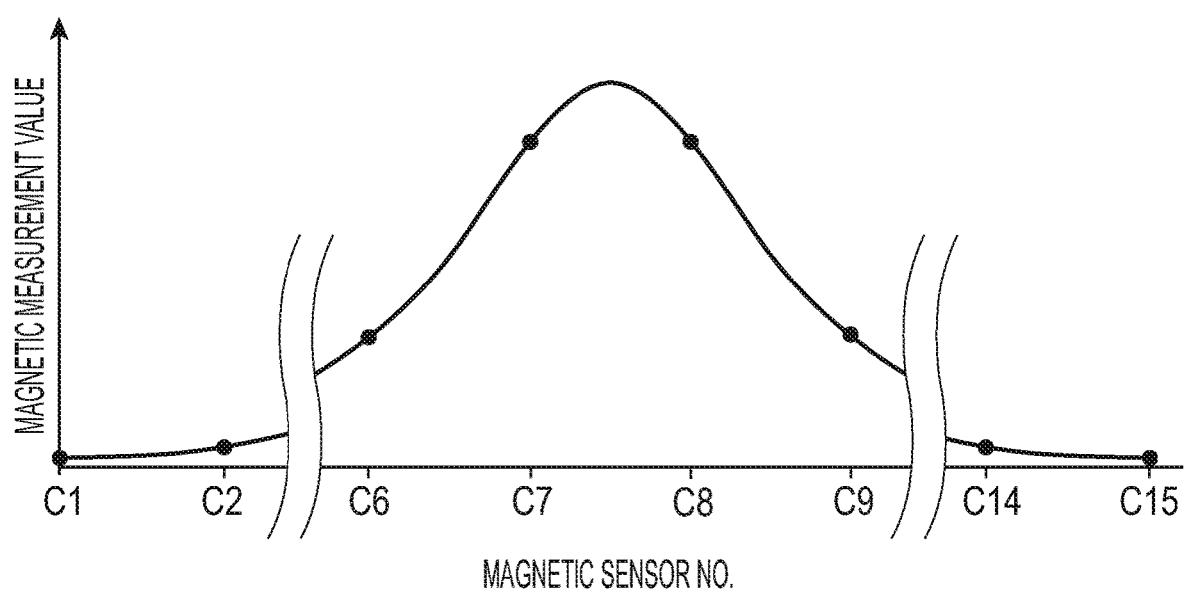

[FIG. 8]
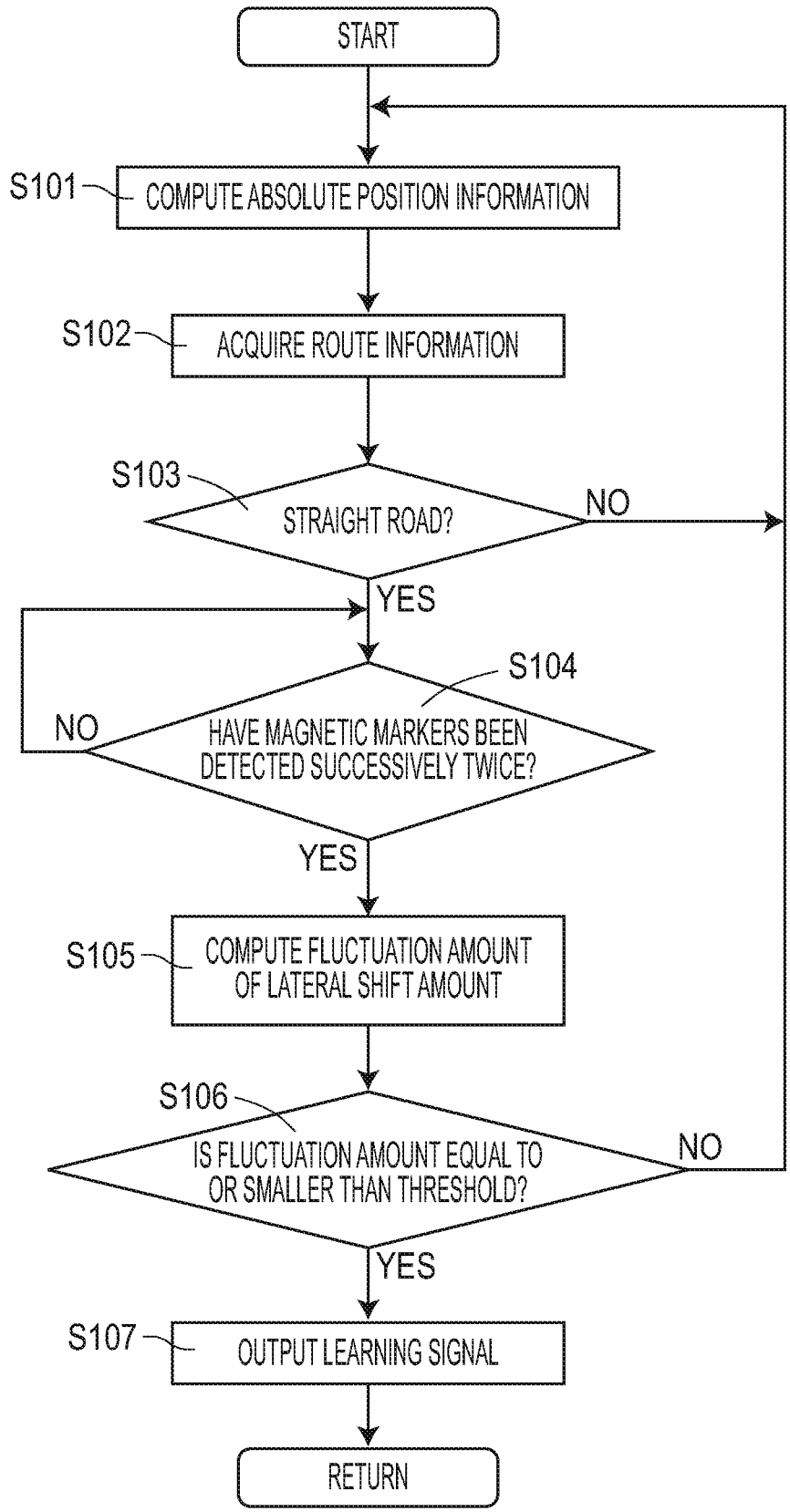

[FIG. 9]
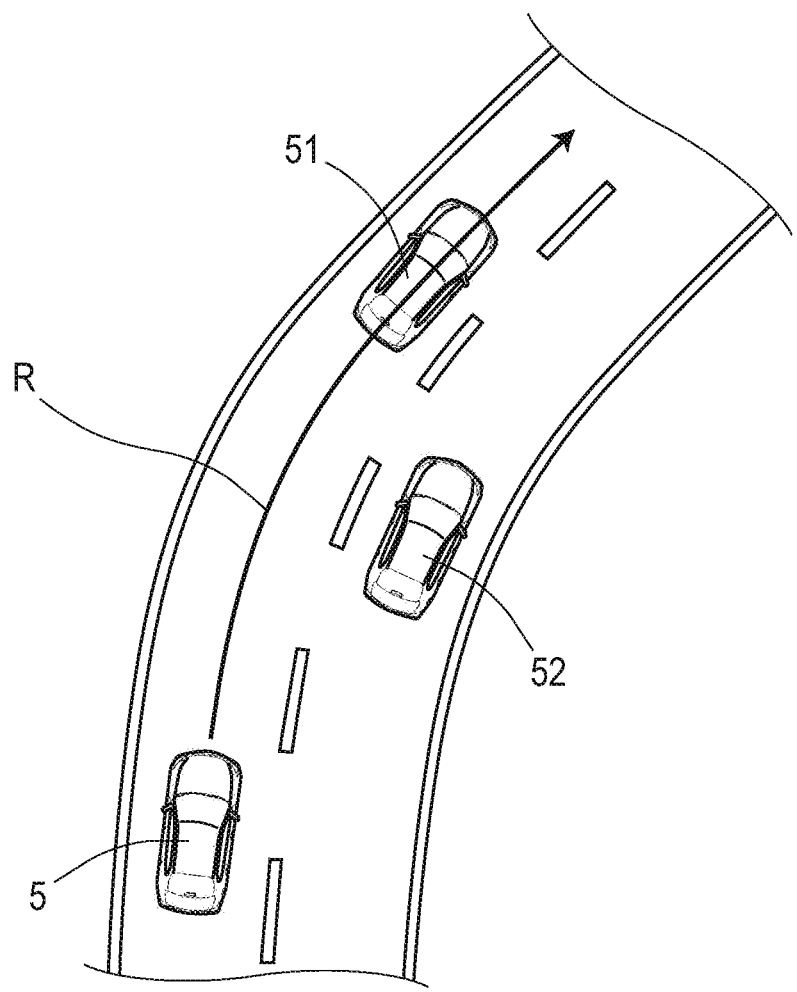

[FIG. 10]
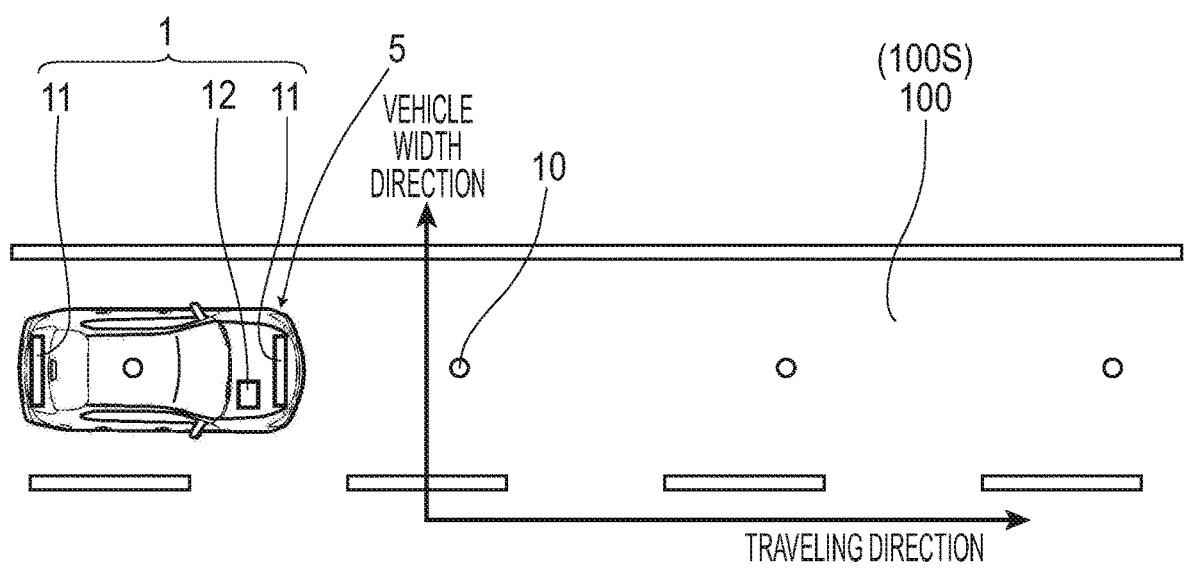

[FIG. 11]
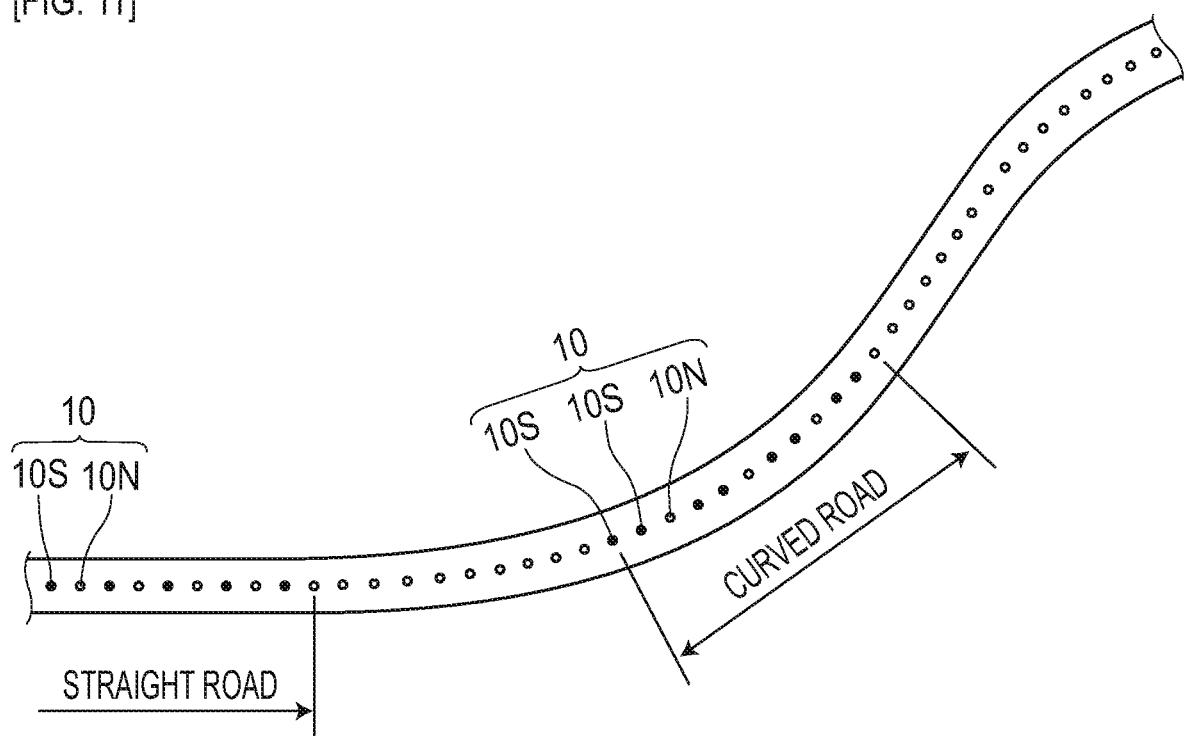

[FIG. 12]
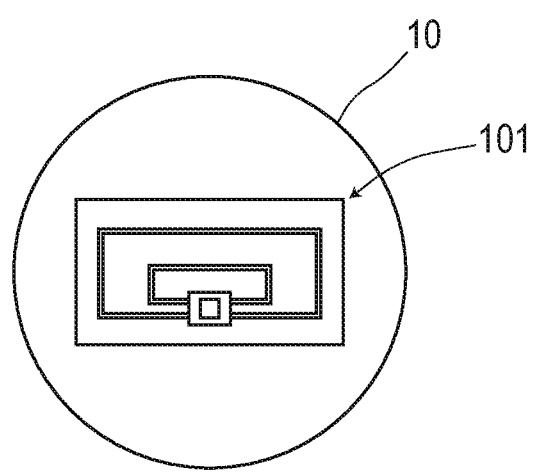

LEARNING SYSTEM AND LEARNING METHOD FOR VEHICLES

CROSS-REFERENCE TO RELATED APPLICATIONS

The present application is based on PCT filing PCT/JP2017/030258, filed Aug. 24, 2017, and claims priority to 2016-168473, filed in the Japanese Patent Office on Aug. 30, 2016, the entire contents of each of which being incorporated herein by reference.

TECHNICAL FIELD

The present invention relates to learning systems and learning methods for vehicles for learning a neutral point of a measurement sensor mounted on a vehicle.

BACKGROUND ART

On vehicles with advanced electronic control in recent years, various measurement sensors are mounted, such as a steering angle sensor (steering sensor) which measures a steering angle of a steering wheel and a yaw rate sensor which measures a yaw rate as a change velocity of a rotation angle of the vehicle in a turning direction. If the steering angle or the yaw rate of the vehicle is measured with high accuracy, course prediction and behavior grasping of the vehicle and so forth can be achieved with high accuracy to help various controls (for example, refer to Patent Literature 1).

CITATION LIST

Patent Literature

Patent Literature 1: Japanese Unexamined Patent Application Publication No. 2007-4711

SUMMARY OF INVENTION

Technical Problem

However, as for the steering angle sensor, the steering angle corresponding to a straight-ahead movement may be subtly different for each vehicle due to an individual difference such as, for example, an attachment error of an axle with respect to a vehicle body, or the steering angle corresponding to a straight-ahead movement may fluctuate due to pneumatic unbalance among tires or the like, thereby posing a fear of impairment of measurement accuracy. As for the yaw rate sensor, in accordance with outer environments such as temperature, a drift or the like may occur in a sensor measurement value to impair measurement accuracy.

The present invention was made in view of the above-described conventional problems, and is to provide a learning system and learning method for vehicles for learning, with high accuracy, a neutral point of a measurement sensor mounted on a vehicle.

Solution to Problem

One aspect of the present invention resides in a learning system for vehicles for learning a neutral point of a measurement sensor equipped in a vehicle by using a magnetic marker disposed in a traveling road, the system including:

a marker detection part which detects the magnetic marker and measures a lateral shift amount of the vehicle with respect to the magnetic marker;

a route information acquiring part which acquires route information indicating a shape of the traveling road; and a learning determination part which determines whether a learning condition as a condition for performing learning of the neutral point of the measurement sensor is satisfied, wherein a fluctuation range of a lateral shift amount measured by the marker detection part when the vehicle is traveling a learning road as a traveling road in a constant shape is equal to or smaller than a predetermined threshold is set at least as the learning condition.

One aspect of the present invention resides in a method for learning a neutral point of a measurement sensor equipped in a vehicle by using a magnetic marker disposed in a traveling road, the method including:

a process of detecting the magnetic marker and measuring a lateral shift amount of the vehicle with respect to the magnetic marker;

a process of acquiring route information indicating a shape of the traveling road; and a process of determining whether a learning condition as a condition for performing learning of the neutral point of the measurement sensor is satisfied, wherein a fluctuation range of a lateral shift amount measured by the marker detection part when the vehicle is traveling a learning road as a traveling road in a constant shape is equal to or smaller than a predetermined threshold is set at least as the learning condition.

In the learning system and learning method for vehicles of the present invention, a learning condition for performing learning of a neutral point of the measurement sensor is set. As one of this learning condition, the fluctuation range of the lateral shift amount when the vehicle is traveling the learning road in a constant shape is equal to or smaller than a predetermined threshold is set.

As for the vehicle traveling the learning road in a constant shape, if the fluctuation range of the lateral shift amount is equal to or smaller than the predetermined threshold, it can be determined that the situation is such that the vehicle is traveling along a straight line or a curved line with a constant curvature. In the situation allowing this determination, the sensor measurement value by the measurement sensor becomes close to stabilization, and is thus suitable for learning a neutral point.

As described above, in the present invention, it is set as one example of the learning condition that the fluctuation range of the lateral shift amount of the vehicle while traveling the learning road is equal to or smaller than the predetermined threshold, thereby allowing highly-accurate neutral point learning at an appropriate timing.

BRIEF DESCRIPTION OF DRAWINGS

FIG. 1 is a block diagram depicting an electrical configuration of a learning system in a first embodiment.

FIG. 2 is a front view of a vehicle having a sensor unit attached thereto in the first embodiment.

FIG. 3 is a configuration diagram of the learning system in the first embodiment.

FIG. 4 is a block diagram depicting the configuration of a magnetic sensor in the first embodiment.

FIG. 5 is a descriptive diagram exemplarily depicting a temporal change of a magnetic distribution in a vehicle width direction at the time of passage over a magnetic marker in the first embodiment.

FIG. 6 is a descriptive diagram exemplarily depicting a temporal change of a peak value of a magnetic measurement value at the time of passage over magnetic markers in the first embodiment.

FIG. 7 is a descriptive diagram of a method of measuring a lateral shift amount in the vehicle width direction in the first embodiment.

FIG. 8 is a flow diagram depicting a flow of neutral point learning in the first embodiment.

FIG. 9 is a descriptive diagram of adaptive cruise control in the first embodiment.

FIG. 10 is a configuration diagram of a learning system in a second embodiment.

FIG. 11 is a descriptive diagram of an example of laying of magnetic markers for providing route information in a third embodiment.

FIG. 12 is a side end face view of a magnetic marker including an RFID tag in the third embodiment.

DESCRIPTION OF EMBODIMENTS

Learning of a neutral point (neutral point learning) in the present invention is learning also called zero point learning for ensuring accuracy of a measurement sensor. For example, neutral point learning regarding a steering angle sensor for measuring an angle of a steering wheel of a vehicle is learning for handling a sensor measurement value corresponding to a steering angle of zero at the time of straight-ahead movement as a neutral point (zero point). Also, for example, neutral point learning regarding a yaw rate sensor for measuring a change velocity (yaw rate) of a rotation angle of the vehicle in a turning direction is learning for handling a sensor measurement value when the yaw rate is zero as a neutral point. In measurement by the measurement sensor, highly-accurate measurement can be achieved by learning a neutral point of the sensor measurement value.

Preferably, the marker detection part in the learning system for vehicles of the present invention is arranged at least two locations separated in a longitudinal direction of the vehicle, and it is set as one of the learning condition that a difference between lateral shift amounts measured with a same magnetic marker by the two marker detection parts placed at different positions in the longitudinal direction is equal to or smaller than a predetermined threshold.

If the lateral shift amount measured with the same magnetic marker by the marker detection parts positioned as separated in the longitudinal direction of the vehicle is excessive, there is a possibility of occurrence of a behavior such as oversteer or understeer in the vehicle. In this situation, there is a possibility that the behavior of the vehicle is unstable, and thus this situation is not suitable for learning a neutral point of the measurement sensor. Thus, if it is set as one of the learning condition that the fluctuation range of the lateral shift amount measured for the same magnetic marker by the two marker detection parts at different positions in the longitudinal direction is equal to or smaller than the predetermined threshold, the situation unsuitable for the learning can be precluded.

The measurement sensor may be a yaw rate sensor for measuring a change velocity of a rotation angle of the vehicle in a turning direction, and the learning road may be a straight road or a curved road with a constant curvature.

In addition to the straight road, in a state in which the vehicle travels along a curved road with a constant curvature, the change velocity of the rotation angle of the vehicle in the turning direction is ideally zero. Therefore, the situation in which the vehicle is traveling along the straight road or the curved road is suitable for learning a neutral point of the yaw rate sensor.

The sensor may be a steering angle sensor which measures a steering angle of a steering wheel of the vehicle, and the learning road may be a straight road.

In the situation in which the vehicle is traveling the straight road, the steering angle is ideally zero, and therefore the situation is suitable for learning of a neutral point of the steering angle sensor. If the neutral point of the steering angle sensor can be learnt with high accuracy, for example, accuracy of course prediction using the steering angle can be improved. If a predicted course is highly accurate, for example, a preceding vehicle as a follow-up target can be identified with high reliability from among preceding vehicles captured by an active sensor such as a laser radar, and accuracy of follow-up control (ACC: adaptive cruise control) with respect to the preceding vehicle can be improved.

The route information acquiring part preferably acquires the route information from the magnetic marker.

As a method of providing the route information from the magnetic marker, there are various methods, for example, a method of providing route information such as a straight road and curved road by using the polarity of the magnetic marker and a method of providing route information by using an arrangement space between magnetic markers. Furthermore, it is preferable that while a radio tag is provided to the magnetic marker, a tag reader corresponding to the radio tag is provided on a vehicle side as the route information acquiring part. Using a communication device such as a wireless tag can provide more information including the route information to the vehicle side.

EMBODIMENTS

Embodiments of the present invention are specifically described by using the following examples.

First Embodiment

The present example is an example of a learning system 1 and learning method for vehicles allowing neutral point learning of a measurement sensor by using magnetic markers 10 laid in a road. Details about this are described by using FIG. 1 to FIG. 9.

The learning system 1 for vehicles is configured to include, as in FIG. 1, a combination of a sensor unit (marker detection part) 11 including magnetic sensors Cn (n is an integer from 1 to 15), a map database 122 having map data including route information about a traveling road, and a control unit 12 which specifies a timing of neutral point learning by using the magnetic marker 10. In the following, the magnetic marker 10 is broadly described, and then the sensor unit 11, the map database 122, the control unit 12, and so forth configuring the learning system 1 are described.

The magnetic marker 10 (FIG. 2 and FIG. 3) is a road marker laid in a road surface 100S so as to be lined up along the center of a lane 100 where a vehicle 5 travels. This magnetic marker 10 is formed in a columnar shape having a diameter of 20 mm and a height of 28 mm, and can be accommodated in a hole provided to the road surface 100S. A magnet forming the magnetic marker 10 is an isotropic ferrite plastic magnet formed by dispersing a magnetic powder of iron oxide as a magnetic material in a polymer material as a base material, and has a characteristic of a maximum energy product (BHmax)=6, 4 kJ/m$^3$. This magnetic marker 10 is laid in a state of being accommodated in the hole bored in the road surface 100S.

Specifications of the magnetic marker 10 of the present example are partially described in Table 1.

TABLE 1

| Type of magnet | Ferrite plastic magnet |
|---|---|
| Diameter | φ 20 mm |
| Height | 28 mm |
| Magnetic flux density Gs of the surface | 45 mT |

This magnetic marker 10 can act with magnetism having a magnetic flux density of 8 μT ($8 \times 10^{-6}$ T, T: tesla) at a height of 250 mm, which is an upper limit of a range from 100 to 250 mm, assumed as an attachment height of the magnetic sensors Cn.

Next, the sensor unit 11, the map database 122, and the control unit 12 configuring the learning system 1 for vehicles are described.

The sensor unit 11 is a unit attached to a vehicle body floor 50 corresponding to a bottom surface of the vehicle 5, as depicted in FIG. 1 to FIG. 3. The sensor unit 11 is attached, for example, near the inside of a front bumper. In the case of vehicle 5 of a sedan type in the present example, any attachment height with reference to the road surface 100S is 200 mm.

The sensor unit 11 includes, as in FIG. 1, fifteen magnetic sensors Cn arrayed on a straight line along a vehicle width direction and a detection processing circuit 110 having a CPU not depicted and so forth incorporated therein.

The detection processing circuit 110 is an arithmetic circuit which performs various computation processes such as a marker detection process for detecting the magnetic marker 10. This detection processing circuit 110 is configured of a CPU (central processing unit) which performs various computations, and also by using elements such as memory elements including a ROM (read only memory) and a RAM (random access memory).

The detection processing circuit 110 performs marker detection process and so forth by acquiring a sensor signal outputted from each magnetic sensor Cn. The results of detection of the magnetic marker 10 computed by the detection processing circuit 110 including a measured lateral shift amount are all inputted to the control unit 12. Note that the sensor unit 11 can perform marker detection process in a period of 3 kHz.

Here, the configuration of each magnetic sensor Cn (FIG. 1) is described. In the present example, as in FIG. 4, a one-chip MI sensor having an MI element 21 and a driving circuit integrated therein is adopted as the magnetic sensor Cn. The MI element 21 is an element including an amorphous wire 211 made of a CoFeSiB-based alloy with approximately zero magnetostriction and a pickup coil 213 wound around this amorphous wire 211. The magnetic sensor Cn detects magnetism acting on the amorphous wire 211 by measuring a voltage occurring at the pickup coil 213 when a pulse current is applied to the amorphous wire 211. The MI element 21 has detection sensitivity in an axial direction of the amorphous wire 211 as a magneto-sensitive body. In each magnetic sensor Cn of the sensor unit 11 of the present example, the amorphous wire 211 is disposed along a vertical direction.

The driving circuit is an electronic circuit including a pulse circuit 23 which supplies a pulse current to the amorphous wire 211 and a signal processing circuit 25 which samples and outputs a voltage occurring at the pickup coil 213 at a predetermined timing. The pulse circuit 23 is a circuit including a pulse generator 231 that generates a pulse signal which is a base signal of a pulse current. The signal processing circuit 25 is a circuit which takes out an induced voltage of the pickup coil 213 via a synchronous detection 251 which is opened and closed in conjunction with a pulse signal, and amplifies the voltage by an amplifier 253 at a predetermined amplification factor. A signal amplified by this signal processing circuit 25 is externally outputted as a sensor signal.

The magnetic sensor Cn is a high-sensitivity sensor having a measurement range of a magnetic flux density of ±0.6 mT and a magnetic flux resolution of 0.02 μT within the measurement range. This high sensitivity is achieved by the MI element 21 using the MI effect in which the impedance of the amorphous wire 211 sensitively changes in accordance with the external magnetic field. Furthermore, this magnetic sensor Cn can perform high-speed sampling in a period of 3 kHz and supports high-speed vehicle traveling. In the present example, the period of magnetic measurement by the sensor unit 11 is set at 3 kHz. The sensor unit 11 inputs the detection result to the control unit 12 every time magnetic measurement is performed.

Specifications of the magnetic sensor Cn are partially described in Table 2.

TABLE 2

| Measuring range | ±0.6 mT |
|---|---|
| Magnetic flux resolution | 0.02 μT |
| Sampling period | 3 kHz |

As described above, the magnetic marker 10 can act with magnetism having a magnetic flux density equal to or larger than 8 μT ($8 \times 10^{-6}$ T) in a range of 100 to 250 mm assumed as an attachment height of the magnetic sensors Cn. The magnetic marker 10 acting with magnetism having a magnetic flux density equal to or larger than 8 μT is detectable with high reliability by using the magnetic sensor Cn having a magnetic flux resolution of 0.02 μT.

Next, the map database 122 is a database having map data stored therein. Linked to the map data is absolute position information. On a vehicle side, the map data around the vehicle can be acquired by using the absolute position information. Furthermore, in the map database 122, type information about a traveling road such as an automobile road and ordinary road and route information including information indicating the shape of the traveling road such as a radius of curvature and width are stored with the absolute position information being linked. On the vehicle side, route information about the traveling road where the own vehicle is traveling can be identified by using the absolute position information. Note that the map database 122 may be a database shared for use by a vehicle-mounted navigation system (omitted in the drawings) which displays a map around the vehicle on a display to guide a route to a destination and so forth.

The control unit 12 is a unit which outputs a learning signal which teaches a timing of learning a neutral point of a steering angle sensor 181 (measurement sensor) mounted on the vehicle 5, as in FIG. 1 to FIG. 3. To the control unit 12, in addition to the sensor unit 11 and the map database 122, a GPS (Global Positioning System) antenna 120, a vehicle ECU 15, and so forth are electrically connected. The learning signal outputted by the control unit 12 is inputted to the vehicle ECU which performs signal processing regarding a sensor signal outputted by the steering angle sensor 181 and so forth. During reception of the learning signal, the vehicle ECU 15 performs neutral point learning regarding the steering angle sensor 181 as an example of the measurement sensor.

The control unit 12 includes an electronic board (omitted in the drawings) having implemented thereon a GPS module which performs positioning computation by the GPS, memory elements such as a ROM and RAM, and so forth, in addition to a CPU which performs various computations. Based on the information acquired from the sensor unit 11 (detection result, lateral shift amount) and the route information indicating the shape of the traveling road acquired from the map database 122, the control unit 12 determines whether a timing is suitable for neutral point learning. Then, in case the timing is suitable for neutral point learning, the control unit 12 externally outputs a learning signal indicating as such. Note that depiction of the vehicle ECU 15 and the steering angle sensor 181 are omitted in FIG. 2 and FIG. 3.

The control unit 12 includes each of the following functions.

(a) Vehicle course judgment part: the part judges whether the vehicle 5 is traveling along the traveling road, based on a temporal change of the lateral shift amount of the vehicle 5 with respect to the magnetic markers 10.

(b) Positioning part: the above-described GPS module, which computes absolute position information about a location where the vehicle 5 is positioned, implements a function as this part.

(c) Route information acquiring part: with reference to the map database 122, the part acquires the route information linked with the absolute position information. The route information includes data indicating the shape of the traveling road, such as a radius of curvature.

(d) Learning determination part: the part judges whether a learning condition is satisfied, which is a determination condition as to whether neutral point learning can be performed. Set as a learning condition is, for example, a condition regarding a fluctuation amount, which is a difference between lateral shift amounts of the vehicle 5 with respect to two magnetic markers 10 laid adjacently to each other.

Next, (1) a marker detection process by the sensor unit 11 to detect the magnetic marker 10 and measure a lateral shift amount is described, and then (2) a flow of operation of the learning system 1 for vehicles is described.

(1) Marker Detection Process

The sensor unit 11 performs marker detection process in a period of 3 kHz. The sensor unit 11 performs sampling on magnetic measurement values indicated by sensor signals from fifteen magnetic sensors Cn for each of periods (p1 to p7) of performing a marker detection process to acquire a magnetic distribution in the vehicle width direction (refer to FIG. 5). The magnitude of a peak value of this magnetic distribution in the vehicle width direction changes with time as depicted in the drawing, and becomes maximum at a timing of passage over the magnetic marker 10 (in the period of p4 in FIG. 5).

When the vehicle 5 travels along the lane 100 (FIG. 3) where the magnetic markers 10 are successively laid, the peak value of the magnetic distribution in the vehicle width direction described above increases every time the vehicle passes over the magnetic marker 10 as in FIG. 6. In the marker detection process, a threshold determination regarding this peak value is performed, and it is determined that the magnetic marker 10 has been detected when the peak value is equal to or larger than a predetermined threshold value.

When detecting the magnetic marker 10, the sensor unit 11 identifies the position of the peak value in the vehicle width direction of the magnetic distribution in the vehicle width direction, which is a distribution of magnetic measurement values of the magnetic sensors Cn. By using the position of this peak value in the vehicle width direction, a lateral shift amount of the vehicle 5 with respect to the magnetic marker 10 can be computed. In the vehicle 5, the sensor unit 11 is attached so that the central magnetic sensor C8 is positioned on the center line of the vehicle 5. Thus, a deviation in the position of the above-described peak value in the vehicle width direction with respect to the magnetic sensor C8 indicates the lateral shift amount of the vehicle 5 with respect to the magnetic marker 10.

In particular, as in FIG. 7, the sensor unit 11 performs curve approximation (quadratic approximation) on the magnetic distribution in the vehicle width direction, which is a distribution of magnetic measurement values of the magnetic sensors Cn, to identify the position of the peak value of an approximation curve in the vehicle width direction. Using the approximation curve can identify the position of the peak value with accuracy finer than a space between the fifteen magnetic sensors, and can measure the lateral shift amount of the vehicle 5 with respect to the magnetic marker 10 with high accuracy.

(2) Entire Operation of Learning System 1

The entire operation of the learning system 1, mainly control by the control unit 12 (FIG. 1), is described by using a flow diagram of FIG. 8.

The control unit 12 computes absolute position information by using satellite radio waves received via the GPS antenna 120 (S101). Then, with reference to the map database 122 by using the absolute position information indicating the position of the own vehicle, the control unit 12 acquires route information indicating the shape of the traveling road including a radius of curvature (S102). The control unit 12 performs a threshold determination regarding the radius of curvature included in the route information to perform a determination as to whether the road is a straight road (S103). Note that as a threshold for the radius of curvature, a sufficiently large value corresponding to the radius of curvature of a straight road is set. If the radius of curvature included in the route information is equal to or larger than the threshold, the road is determined as a straight road.

If the traveling road is a straight road usable as a learning road (S103: YES), the control unit 12 repeats the above-described marker detection process (S104: NO) until detecting the magnetic markers 10 (FIG. 3) successively twice and allowing a lateral shift amount to be measured for each. When a lateral shift amount is allowed to be measured for two magnetic markers 10 laid adjacent to each other along the traveling road (S104: YES), the control unit 12 computes a fluctuation amount, which is a difference between the lateral shift amounts (S105).

The control unit 12 performs a threshold determination regarding the fluctuation amount of this lateral shift amount (S106). If the fluctuation amount of the lateral shift amount is equal to or smaller than the predetermined threshold (S106: YES), the control unit 12 determines that the vehicle 5 is traveling straight along the traveling road, and outputs a learning signal as it is determined that the learning condition of neutral point learning is satisfied (S107).

On the other hand, if the fluctuation amount of the lateral shift amount exceeds the threshold (S106: NO), the control unit 12 determines that the vehicle 5 is traveling not along the traveling road, and repeats the above-described steps S101 to S106. Note that as a threshold regarding the fluctuation amount of the lateral shift amount, it is preferable to set a threshold to the extent that it can be determined that the vehicle is traveling straight along a straight road as a traveling road. Note that it may be determined whether the vehicle is traveling along the traveling road by using a lateral shift amount for three or more magnetic markers, for example, by performing threshold process on a fluctuation range of the lateral shift amount for three or more magnetic markers.

The vehicle ECU 15 performs neutral point learning on the steering angle sensor 181 in a state in which a learning signal of the control unit 12 is being received. Specifically, the steering angle during reception of the learning signal is regarded as being at a zero degree corresponding to a straight-ahead movement and the sensor measurement value indicated by the sensor signal outputted from the steering angle sensor 181 at that time is learnt as a neutral point (zero point). Performing neutral point learning on the steering angle sensor 181 by the vehicle ECU 15 in this manner improves accuracy of the steering angle based on the sensor measurement values indicated by the sensor signals of the steering angle sensor 181.

A learning method for vehicles by the learning system 1 as described above is a usable method of identifying a traveling situation suitable for neutral point learning with high accuracy and allowing highly-accurate measurement by the measurement sensor by neutral point learning under this traveling situation. In particular, in this learning method, the lateral shift amount in the vehicle width direction is measured by using the magnetic marker 10, and the traveling situation suitable for neutral point learning is identified with high reliability.

For example, if the vehicle 5 performs follow-up control (adaptive cruise control) by measuring a distance to a preceding vehicle by a laser radar sensor, as in FIG. 9, of preceding vehicles 51 and 52 detected by the laser radar sensor, the preceding vehicle 51 as a follow-up target on a predicted course R of the own vehicle based on the steering angle can be identified with high reliability, and highly-accurate follow-up control can be achieved.

As a measurement sensor as a neutral point learning target, in addition to the steering angle sensor 181, a yaw rate sensor may be used. As for the yaw rate sensor, neutral point learning can be performed by using the learning signal of the present example. Furthermore, as for the yaw rate sensor, a curved road with a constant curvature can be included in the learning road. Using a radius of curvature included in the route information read from the map database 122 can determine whether the road is a curved road with a constant curvature. Learning the neutral point of the yaw rate sensor with high accuracy can measure, with high accuracy, a change velocity of the rotation angle of the vehicle in the turning direction. An accurate yaw rate is effective for ensuring accuracy of various vehicle controls having behaviors of the vehicle reflected thereon, such as brake control and throttle control.

In the present example, the configuration is exemplarily described in which the sensor unit 11 performs marker detection process and inputs the detection result including the lateral shift amount to the control unit 12. In place of this, a configuration may be adopted in which the control unit 12 capturing the sensor signals of the magnetic sensors Cn performs the above-described marker detection process.

In the sensor unit 11, common noise acts on each magnetic sensor Cn, which is almost uniform magnetic noise derived from, in addition to geomagnetism, a large-sized magnetism generation source such as, for example, an iron bridge or another vehicle. This common noise has a high possibility of almost uniformly acting on each magnetic sensor Cn of the sensor unit 11. Thus, the magnetic marker 10 may be detected by using a differential value between the magnetic measurement values of the respective magnetic sensors Cn arrayed in the vehicle width direction. This differential value indicating a magnetic gradient in the vehicle width direction can effectively reduce common noise almost uniformly acting on each magnetic sensor Cn.

In the present example, while the magnetic sensors Cn having sensitivity in the vertical direction are adopted, magnetic sensors having sensitivity in the traveling direction or magnetic sensors having sensitivity in the vehicle width direction may be adopted. Furthermore, for example, magnetic sensors having sensitivity in two axial directions of the vehicle width direction and the traveling direction, two axial directions of the vehicle width direction and the vertical direction, or two axial directions of the traveling direction and the vertical direction may be adopted. For example, a magnetic sensor having sensitivity in three axial directions of the vehicle width direction, the traveling direction, and the vertical direction may be adopted. Using a magnetic sensor having sensitivity in a plurality of axial directions can measure a magnetism acting direction together with the magnitude of magnetism and can generate magnetic vectors. By using a difference between the magnetic vectors and a change rate of the difference in the traveling direction, a distinction between magnetism of the magnetic markers 10 and disturbance magnetism can be made.

In the present example, the magnetic marker made of a ferrite plastic magnet is exemplarily described. Alternatively, a magnetic marker made of a ferrite rubber magnet may be used.

In the present example, the radius of curvature is exemplarily described as an example of route information indicating the shape of the traveling road. In place of this, attribute information such as a straight road and curved road (with a constant curvature) may be used as route information indicating the shape of the traveling road.

Second Embodiment

The present example is an example of the learning system 1 for vehicles having sensor units 11 at the front and rear of the vehicle based on the first embodiment. Details about this are described with reference to FIG. 10.

In neutral point learning by the steering angle sensor of the present example, in addition to the learning condition that the fluctuation amount of the lateral shift amount when the vehicle 5 is traveling the straight road is equal to or smaller than the threshold, a learning condition is added that an unstable behavior does not occur in the vehicle 5.

In the learning system 1 for vehicles of the present example, the presence or absence of an unstable behavior of the vehicle 5 is determined by using the front and rear sensor units 11. Specifically, attention is paid to a differential value between a lateral shift amount measured by the front-side sensor unit 11 and a lateral shift amount measured by the rear-side sensor unit 11. If this differential value is larger than a threshold, it is determined that there is a possibility of occurrence of a behavior such as oversteer or understeer. Then, by avoiding neutral point learning in a situation in which there is a possibility of occurrence of an unstable behavior as described above, highly-accurate detection of a steering angle can be made.

According to the learning condition added and set in the present example, neutral point learning under a situation where a behavior such as understeer occurs in the vehicle 5 can be prevented from being performed, and a fear of loss of accuracy of the measurement sensor can be prevented.

Note that other configurations and operations and effects are the same as to those in the first embodiment.

Third Embodiment

The present example is an example in which the method of acquiring the route information about the traveling road is changed based on the learning system for vehicles in the first embodiment. The route information acquiring part of the learning system of the present example is configured to acquire route information from a magnetic marker 10 side. Details about this are described with reference to FIG. 11 and FIG. 12.

The magnetic markers 10 laid in the traveling road have different polarities as in FIG. 11, depending on whether the road is a straight road or curved road suitable for neutral point learning for the measurement sensor, or another road.

On a straight road, magnetic markers 10S with the S pole on its upper surface (referred to as S-pole magnetic markers as appropriate) and magnetic markers 10N with the N pole on its upper surface (referred to as N-pole magnetic markers as appropriate) are alternately arranged. On a curved road with a constant curvature, the magnetic markers 10 are laid so that a combination of three magnetic markers 10 is repeated in which after successive two S-pole magnetic markers 10S, one N-pole magnetic marker 10N appears. In a traveling road other than the above, the N-pole magnetic markers 10N are laid.

The route information acquiring part on the vehicle side detects the polarity of the detected magnetic marker 10 to acquire route information such as a straight road, a curved road, and others.

In place of the above-described structure, as depicted in FIG. 12, an RFID tag (radio tag) 101 may be provided to the magnetic marker 10 on the traveling road. For example, the RFID tag (radio tag) 101 in a sheet shape is preferably laminated on an end face of the magnetic marker 10 on an underground side. The route information acquiring part on the vehicle side is preferably configured to include a tag reader which receives information wirelessly transmitted by the RFID tag 101. The tag reader operates the RFID tag 101 via wireless power supply, and receives information transmitted by the RFID tag 101. The information transmitted by the RFID tag 101 preferably include route information indicating the shape of the traveling road such as a radius of curvature or a curvature.

Also, magnetic markers are preferably arranged in a specific pattern at a starting point and an endpoint of a traveling road usable as a learning road, such as a straight road or a curved road (with a constant curvature). For example, at the starting point and the end point, a plurality of magnetic markers 10 are preferably arranged in the vehicle width direction. For example, two magnetic markers may be arranged in the vehicle width direction at the starting point or the like of a straight road, and three magnetic markers may be arranged in the vehicle width direction at the starting point or the like of a curved road. Furthermore, the arrangement space between the magnetic markers 10 in the longitudinal direction of the traveling road is preferably varied. For example, with respect to a space between magnetic markers serving as a reference, the space may be ½ at the starting point or the like of a straight road, and the space may be ⅓ at the starting point or the like of a curved road.

Note that other configurations and operations and effects are the same as to those in the first embodiment.

While specific examples of the present invention have been described in detail in the foregoing as in the examples, these specific examples each merely disclose an example of technology included in the scope of claims for patent. Needless to say, the scope of claims for patent should not be construed as being limited by the configuration, numerical values, and so forth of the specific examples. The scope of claims for patent includes techniques acquired by variously modifying, changing, or combining the above-described specific examples by using known technology, knowledge of people skilled in the art, and so forth.

REFERENCE SIGNS LIST 1 learning system
10 magnetic marker
101 RFID tag (radio tag)
100 lane
11 sensor unit (marker detection part)
110 detection processing circuit
12 control unit (vehicle course judgment part, positioning part, route information acquiring part, learning determination part)
181 steering angle sensor (measurement sensor)
21 MI element
5 vehicle

The invention claimed is:
1. A learning system for vehicles, the system comprising:
a magnetic sensor that detects a magnetic marker disposed in a traveling road; and
processing circuitry configured to
calculate a lateral shift amount of a vehicle with respect to the magnetic marker based on a detection result of the magnetic marker by the magnetic sensor,
acquire route information indicating a shape of the traveling road,
determine whether a learning condition as a condition for performing learning of a neutral point of a measurement sensor equipped in the vehicle is satisfied, the neutral point being a measurement value measured by the measurement sensor when a physical Quantity of a measurement target is zero, and
in response to determining that the learning condition is satisfied, perform the learning using, as the neutral point, a measurement value measured by the measurement sensor at a time when the learning condition is determined to be satisfied, wherein
the learning condition is satisfied when a fluctuation range of the calculated lateral shift amount when the vehicle is traveling a learning road having a constant shape is equal to or smaller than a predetermined threshold.
2. The learning system for vehicles according to claim 1, wherein
the magnetic sensor is arranged in at least two locations separated in a longitudinal direction of the vehicle, and it is set as one of the learning condition that a difference between lateral shift amounts measured with a same magnetic marker by the two magnetic sensors placed at different positions in the longitudinal direction is equal to or smaller than a predetermined threshold.

3. The learning system for vehicles according to claim 2, wherein
the measurement sensor is a yaw rate sensor for measuring a change velocity of a rotation angle of the vehicle in a turning direction, and the learning road is a straight road or a curved road with a constant curvature.

4. The learning system for vehicles according to claim 3, wherein
the measurement sensor is a steering angle sensor which measures a steering angle of a steering wheel of the vehicle, and the learning road is a straight road.

5. The learning system for vehicles according to claim 4, wherein
the processing circuitry acquires the route information from the magnetic marker.

6. The learning system for vehicles according to claim 3, wherein
the processing circuitry acquires the route information from the magnetic marker.

7. The learning system for vehicles according to claim 2, wherein
the measurement sensor is a steering angle sensor which measures a steering angle of a steering wheel of the vehicle, and the learning road is a straight road.

8. The learning system for vehicles according to claim 7, wherein
the processing circuitry acquires the route information from the magnetic marker.

9. The learning system for vehicles according to claim 2, wherein
the processing circuitry acquires the route information from the magnetic marker.

10. The learning system for vehicles according to claim 1, wherein
the measurement sensor is a yaw rate sensor for measuring a change velocity of a rotation angle of the vehicle in a turning direction, and the learning road is a straight road or a curved road with a constant curvature.

11. The learning system for vehicles according to claim 10, wherein
the measurement sensor is a steering angle sensor which measures a steering angle of a steering wheel of the vehicle, and the learning road is a straight road.

12. The learning system for vehicles according to claim 11, wherein
the processing circuitry acquires the route information from the magnetic marker.

13. The learning system for vehicles according to claim 10, wherein
the processing circuitry acquires the route information from the magnetic marker.

14. The learning system for vehicles according to claim 1, wherein
the measurement sensor is a steering angle sensor which measures a steering angle of a steering wheel of the vehicle, and the learning road is a straight road.

15. The learning system for vehicles according to claim 14, wherein
the processing circuitry acquires the route information from the magnetic marker.

16. The learning system for vehicles according to claim 1, wherein
the processing circuitry acquires the route information from the magnetic marker.

17. The learning system for vehicles according to claim 1, further comprising:
another processing circuitry configure to output a learning signal when the processing circuitry determines the learning condition is satisfied, wherein
the processing circuitry performs the learning when the processing circuitry receives the learning signal from the another processing circuitry.

18. A method for learning, the method comprising:
detecting, using a magnetic sensor, a magnetic marker disposed in a traveling road;
calculating, using processing circuitry, a lateral shift amount of a vehicle with respect to the magnetic marker based on a detection result of the magnetic marker by the magnetic sensor:
acquiring route information indicating a shape of the traveling road;
determining, using the processing circuitry, whether a learning condition as a condition for performing learning of a neutral point of a measurement sensor equipped in the vehicle is satisfied, the neutral point being a measurement value measured by the measurement sensor when a physical quantity of a measurement target is zero; and
in response to determining that the learning condition is satisfied, performing, using the processing circuitry, the learning using, as the neutral point, a measurement value measured by the measurement sensor at a time when the learning condition is determined to be satisfied, wherein
the learning condition is satisfied when a fluctuation range of the calculated lateral shift amount when the vehicle is traveling a learning road having a constant shape is equal to or smaller than a predetermined threshold.

* * * * *